US 10,707,140 B2

(12) United States Patent
Sato et al.

(10) Patent No.: US 10,707,140 B2
(45) Date of Patent: Jul. 7, 2020

(54) METHOD FOR EVALUATING SURFACE DEFECTS OF SUBSTRATE TO BE BONDED

(71) Applicant: SHIN-ETSU HANDOTAI CO., LTD., Tokyo (JP)

(72) Inventors: Kazuya Sato, Nasushiobara (JP); Hiromasa Hashimoto, Nishigo-mura (JP); Tsuyoshi Nishizawa, Nishigo-mura (JP); Hirotaka Horie, Annaka (JP)

(73) Assignee: SHIN-ETSU HANDOTAI CO., LTD., Tokyo (JP)

( * ) Notice: Subject to any disclaimer, the term of this patent is extended or adjusted under 35 U.S.C. 154(b) by 0 days.

(21) Appl. No.: 16/327,482

(22) PCT Filed: Jul. 26, 2017

(86) PCT No.: PCT/JP2017/027102
§ 371 (c)(1),
(2) Date: Feb. 22, 2019

(87) PCT Pub. No.: WO2018/047501
PCT Pub. Date: Mar. 15, 2018

(65) Prior Publication Data
US 2019/0181059 A1    Jun. 13, 2019

(30) Foreign Application Priority Data

Sep. 7, 2016  (JP) .................. 2016-175044

(51) Int. Cl.
*H01L 21/02*   (2006.01)
*H01L 21/66*   (2006.01)
(Continued)

(52) U.S. Cl.
CPC .............. *H01L 22/20* (2013.01); *G01N 1/32* (2013.01); *G01N 21/9501* (2013.01);
(Continued)

(58) Field of Classification Search
CPC ............... H01L 22/20; H01L 21/02024; H01L 21/02381; H01L 21/02428;
(Continued)

(56) References Cited

U.S. PATENT DOCUMENTS

2007/0165211 A1* 7/2007 Ishikawa .......... G01N 21/95607
356/145
2017/0033002 A1  2/2017 Meguro et al.
2017/0040210 A1  2/2017 Wakabayashi et al.

FOREIGN PATENT DOCUMENTS

JP   2007-192651 A   8/2007
JP   2010-021242 A   1/2010
(Continued)

OTHER PUBLICATIONS

Oct. 17, 2017 International Search Report issued in International Patent Application No. PCT/JP2017/027102.

*Primary Examiner* — Kyoung Lee
(74) *Attorney, Agent, or Firm* — Oliff PLC (57) ABSTRACT

A method for evaluating surface defects of a substrate to be bonded: preparing a mirror-polished silicon single crystal substrate; inspecting surface defects on the mirror-polished silicon single crystal substrate; depositing a polycrystalline silicon layer on a surface of the silicon single crystal substrate subjected to the defect inspection; performing mirror edge polishing to the silicon single crystal substrate having the polycrystalline silicon layer deposited thereon; polishing a surface of the polycrystalline silicon layer; inspecting surface defects on the polished polycrystalline silicon layer; and comparing coordinates of defects detected at the step of inspecting the surface defects on the silicon single crystal substrate with counterparts detected at the step of inspecting the surface defects on the polycrystalline silicone layer and determining quality of the silicon single crystal substrate having the polycrystalline silicon layer as a
(Continued)

substrate to be bonded on the basis of presence/absence of defects present at the same position.

2 Claims, 4 Drawing Sheets

(51) Int. Cl.
*G01N 21/956* (2006.01)
*G01N 1/32* (2006.01)
*G01N 21/95* (2006.01)
*H01L 21/762* (2006.01)

(52) U.S. Cl.
CPC ..... *G01N 21/956* (2013.01); *H01L 21/02024* (2013.01); *H01L 21/02381* (2013.01); *H01L 21/02428* (2013.01); *H01L 21/02532* (2013.01); *H01L 21/02595* (2013.01); *H01L 21/02634* (2013.01); *H01L 21/02664* (2013.01); *H01L 21/76251* (2013.01); *H01L 22/12* (2013.01)

(58) Field of Classification Search
CPC ......... H01L 21/02532; H01L 21/02595; H01L 21/02634; H01L 21/02664; H01L 21/76251; H01L 22/12; G01N 21/956; G01N 1/32; G01N 21/9501
See application file for complete search history.

(56) References Cited

FOREIGN PATENT DOCUMENTS

| | | |
|---|---|---|
| JP | 2015-211061 A | 11/2015 |
| JP | 2015-211074 A | 11/2015 |

* cited by examiner

[FIG. 1]

A: PREPARE MIRROR-POLISHED SILICON SINGLE CRYSTAL SUBSTRATE (PW)

B: INSPECT SURFACE DEFECTS ON PW → RECORD COORDINATES OF DETECTED DEFECTS

C: DEPOSIT POLYCRYSTALLINE SILICON LAYER ON SURFACE OF PW SUBJECTED TO DEFECT INSPECTION

D: PERFORM MIRROR EDGE POLISHING TO PW HAVING POLYCRYSTALLINE SILICON LAYER DEPOSITED THEREON

E: POLISH SURFACE OF POLYCRYSTALLINE SILICON LAYER

F: INSPECT SURFACE DEFECTS ON POLISHED POLYCRYSTALLINE SILICON LAYER → RECORD COORDINATES OF DETECTED DEFECTS

G: COMPARE COORDINATES OF DEFECTS DETECTED BY PW SURFACE DEFECT INSPECTION WITH COUNTERPARTS DETECTED BY POLYCRYSTALLINE SILICON LAYER DEFECT INSPECTION, DETERMINE QUALITY OF SILICON SINGLE CRYSTAL SUBSTRATE HAVING POLYCRYSTALLINE SILICON LAYER AS SUBSTRATE TO BE BONDED ON BASIS OF PRESENCE/ABSENCE OF DEFECTS PRESENT AT SAME POSITION

[FIG. 2]

□ SURFACE DEFECTS BEFORE DEPOSITION OF POLYCRYSTALLINE Si
○ SURFACE DEFECTS AFTER DEPOSITION OF POLYCRYSTALLINE Si LAYER

METHOD FOR EVALUATING SURFACE DEFECTS OF SUBSTRATE TO BE BONDED

TECHNICAL FIELD

The present invention relates to a method for evaluating surface defects of substrate to be bonded.

BACKGROUND ART

In a process of a bonded SOI wafer for advanced radio frequency devices, a silicon substrate having a polycrystalline silicon layer formed on a surface layer thereof is used as a base wafer in some situations. A bond wafer is additionally prepared in addition to this base wafer, both the wafers are bonded, and then the bond wafer is thinned to fabricate the bonded SOI wafer.

Figure 6:
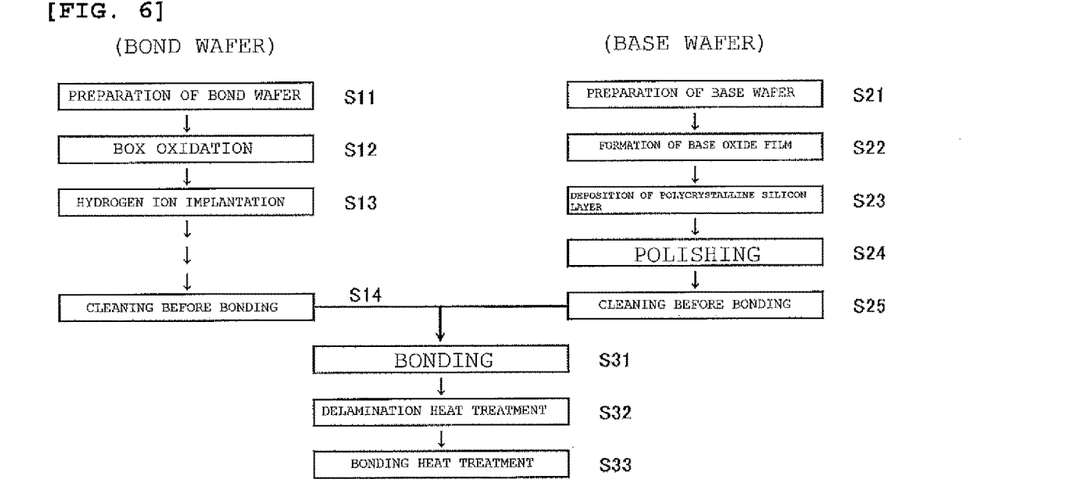
FIG. 6 is a process flowchart of a conventional method for manufacturing a bonded SOI wafer.
Figure 7:
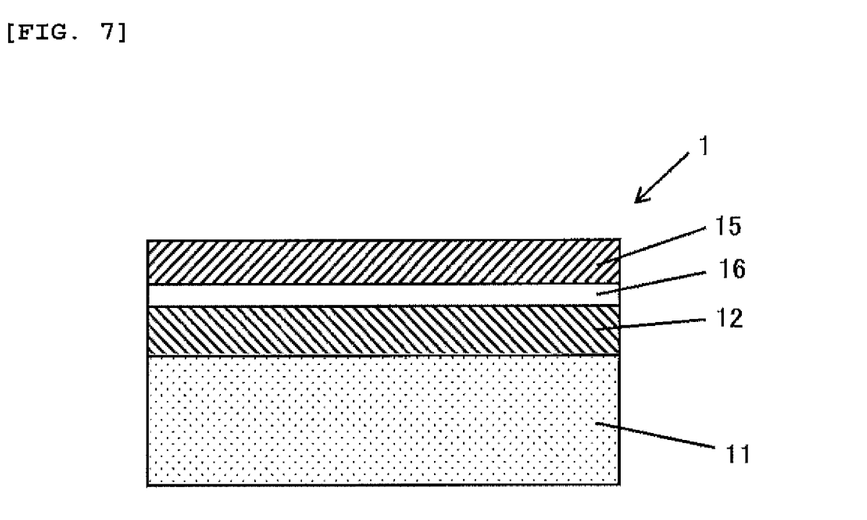
FIG. 7 is a cross-sectional view of a bonded SOI wafer.

Each of Patent Literature 1 and Patent Literature 2 describes a method for manufacturing a bonded SOI wafer for radio frequency devices which uses a polycrystalline silicon layer as a carrier trap layer (which is also referred to as a trap-rich layer). FIG. 6 shows a process flow of the method for manufacturing a bonded SOI wafer described in each of Patent Literature 1 and Patent Literature 2. They have a description that, as shown in FIG. 6, in the method for manufacturing a bonded SOI wafer, a polycrystalline silicon layer is deposited on a base wafer (S23), and then a surface of the polycrystalline silicon layer is polished (S24), and the base wafer is bonded to the bond wafer (S31). Further, FIG. 7 shows an example of a cross section of the bonded SOI wafer manufactured in this manner. In the bonded SOI wafer 1 shown in FIG. 7, a polycrystalline silicon layer 12, a buried oxide film layer (a BOX layer) 16, and an SOI layer 15 are formed on the base wafer 11 in the mentioned order.

CITATION LIST

Patent Literatures

Patent Literature 1: Japanese Unexamined Patent Application Publication No. 2015-211074
Patent Literature 2: Japanese Unexamined Patent Application Publication No. 2015-211061

SUMMARY OF INVENTION

Technical Problem

As a main failure item of bonded SOI wafers, there is a local unbonded region called a void defect, and its improvement has been demanded. In a manufacturing process of substrates to be bonded, it is known that each pit defect is one of causes of the void defects in the bonded SOI wafers. Thus, reducing a pit defect occurrence ratio and detecting pits at high sensitivity to prevent outflow to a bonding step are demanded.

As a current method for detecting surface defects, there is a method for detecting surface detects by a defect inspection device using a light scattering method or differential interferometry as a detection principle. In a bonded wafer manufacturing process, providing size and quantity standards to surface defects detected by the defect inspection device prevents outflow of the surface defects to the bonding step. Although a void occurrence ratio at the bonding step can be reduced by lowering an upper limit of the quantity standard, a problem of degradation of a manufacturing yield of the substrates to be bonded also arises. At this time, if defects causing voids alone can be efficiently detected, unnecessary loss of the manufacturing yield of the substrates to be bonded can be avoided, and the void occurrence ratio after bonding can be also reduced. On the basis of such a background, in the substrate-to-be-bonded manufacturing step, a method for evaluating surfaces defects which detects only defects causing voids at high sensitivity has been demanded.

In view of the above described problem, it is an object of the present invention to provide a method for evaluating surface defects of a substrate-to-be-bonded which enables rationally avoiding a reduction in manufacturing yield of a substrate to be bonded and reducing a void defect occurrence ratio after bonding by detecting surface defects of the substrate to be bonded, which can cause void defects in a bonded SOI wafer, at high sensitivity.

Solution to Problem

To achieve the object, the present invention provides a method for evaluating surface defects of a substrate to be bonded, including the steps of:

preparing a mirror-polished silicon single crystal substrate;

inspecting surface defects on the mirror-polished silicon single crystal substrate;

depositing a polycrystalline silicon layer on a surface of the silicon single crystal substrate subjected to the defect inspection;

performing mirror edge polishing to the silicon single crystal substrate having the polycrystalline silicon layer deposited thereon;

polishing a surface of the polycrystalline silicon layer;

inspecting surface defects on the polished polycrystalline silicon layer; and comparing coordinates of defects detected at the step of inspecting the surface defects on the silicon single crystal substrate with counterparts detected at the step of inspecting the surface defects on the polycrystalline silicone layer and determining quality of the silicon single crystal substrate having the polycrystalline silicon layer as a substrate to be bonded on the basis of presence/absence of defects present at the same position.

As described above, when the surface defects are inspected on both the surface of the mirror-polished silicon single crystal substrate and the surface of the polycrystalline silicon layer which has been polished after deposition of the polycrystalline silicon layer and only the substrate to be bonded having the surface defects at the same position is determined as a defective product, both rational avoidance of a reduction in manufacturing yield of the substrate-to-be-bonded and a reduction in void defect occurrence ratio of the bonded SOI wafer can be achieved.

At this time, it is preferable that the substrate to be bonded is a base wafer for a bonded SOI wafer.

As described above, when the substrate to be bonded is the base wafer for the bonded SOI wafer, the method for evaluating surface defects of a substrate to be bonded according to the present invention can be preferably applied to a process of manufacturing a bonded SOI wafer for advance radio frequency devices.

Advantageous Effects of Invention

According to the present invention, when surface defects are inspected on both the surface of the mirror-polished silicon single crystal substrate before depositing the polycrystalline silicon layer and the surface of the polycrystalline silicon layer polished after depositing the polycrystalline silicon layer and only the substrate to be bonded having the surface defects at the same position is determined as a defective product, both avoidance of manufacturing yield loss of the substrate to be bonded and a reduction in void defect occurrence ratio of the bonded SOI wafer can be achieved.

DESCRIPTION OF EMBODIMENT

As described above, in methods for evaluating surface defects of a substrate to be bonded, a method for evaluating surface defects of a substrate-to-be-bonded which enables avoiding loss of a manufacturing yield of the substrate to be bonded and reducing a void defect occurrence ratio of a bonded SOI wafer has been demanded.

As a result of conducting keen examinations to achieve the object, the present inventors have discovered that the problem can be solved by inspecting surface defects on both a PW (Polished Wafer) surface before depositing a polycrystalline silicon layer and a polycrystalline silicon layer surface polished after depositing the polycrystalline silicon layer and determining only wafers having surface defects at the same position as defective products, thus bringing the present invention to completion.

A detailed description will be given below on the present invention with reference to the drawings, but the present invention is not restricted thereto.

First, a relationship between defects on the PW surface and defects on the polished polycrystalline silicon layer surface was examined. Usually, in the substrate to be bonded, the polycrystalline silicon layer is deposited with a thickness of 2 to 3 µm, and then polished by 0.4 to 1 µm to reduce surface roughness. The PW surface before deposition of the polycrystalline silicon layer and the polycrystalline silicon layer surface after deposition of the polycrystalline silicon layer and after polishing were measured with a detection threshold value of 250 nm by using a surface defect inspection machine such as SurfScan SP2 manufactured by KLA-TENCOR CORPORATION. Defect coordinates of both the surfaces were compared and collated, and then presence of defects at the same position was discovered.

Figure 2:
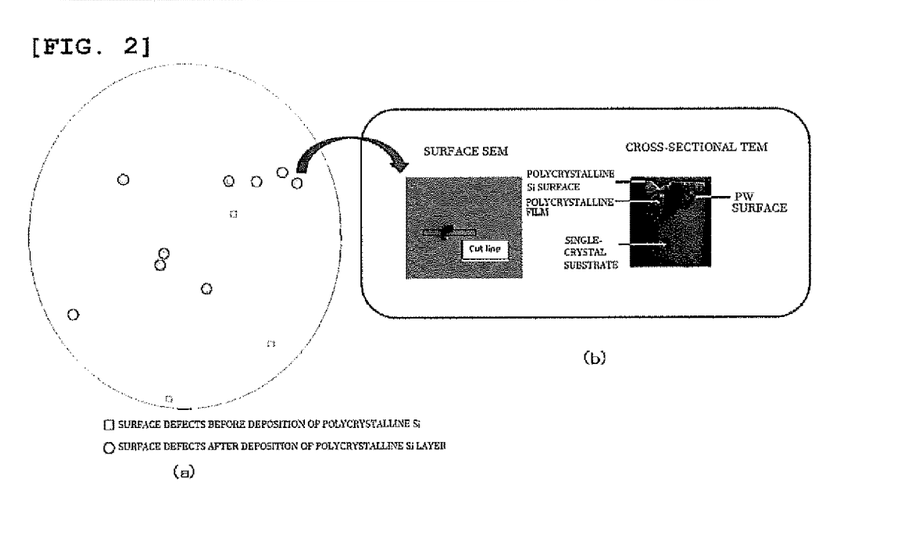
FIG. 2 is an overlapped map (a) of surface LPDs (Light Point Defects) before and after deposition of a polycrystalline silicon layer and a surface SEM/cross-sectional TEM image (b) of defects detected at the same position.

The defects present at the same position were analyzed in detail. FIG. 2 is an overlapped map (FIG. 2(a)) of surface LPDs before and after deposition of the polycrystalline silicon layer and a surface SEM/cross-sectional TEM image (FIG. 2(b)) of a defect detected at the same position. As shown in FIG. 2(a), it is often the case that the positions of the surface defects before deposition of the polycrystalline silicon layer coincide with the positions of the surface defects after deposition of the polycrystalline silicon layer.

FIG. 2(b) shows an example of a result obtained by analyzing surface defects whose positions coincide with each other with the use of a surface SEM (Scanning Electron Microscope) and a cross-sectional. TEM (Transmission Electron Microscope). The analysis using the cross-sectional TEM has revealed that the defect on the PW surface is a pit and the defect on the polycrystalline silicon layer surface is also a pit.

Figure 3:
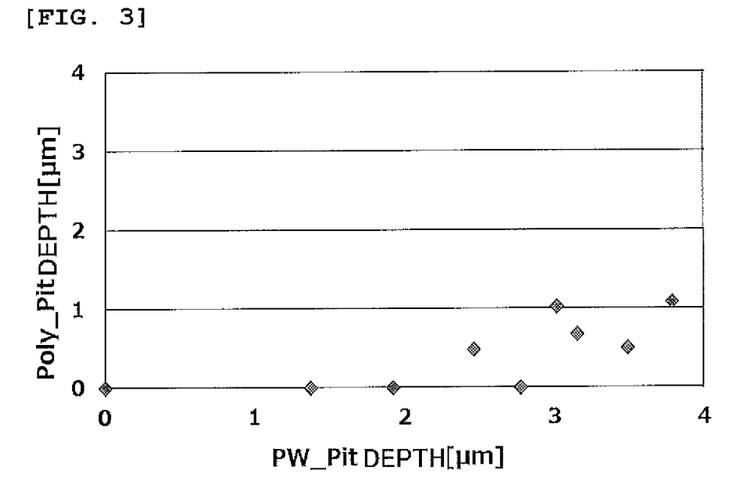
FIG. 3 is a graph showing a relationship between a pit depth of a mirror-polished silicon single crystal substrate (PW) surface and a pit depth of a polycrystalline silicon layer surface (after polishing)

Conducting further evaluation and analysis has revealed that a pit depth of the PW surface and a pit depth of the polished polycrystalline silicon layer surface have a relationship shown in FIG. 3.

On the basis of the result shown in FIG. 3, it has been found out that, when the PW surface has a pit whose depth is 3 µm or more, the pit cannot be filled in the polycrystalline silicon layer, and the pit also remains on the polycrystalline silicon layer surface even if polishing is performed. On the contrary, the result suggests that, when the pit depth of the PW surface is less than 3 µm, the pit can be filled in the polycrystalline silicon layer, or it is completely flattened by polishing even though it is not perfectly filled.

Figure 4:
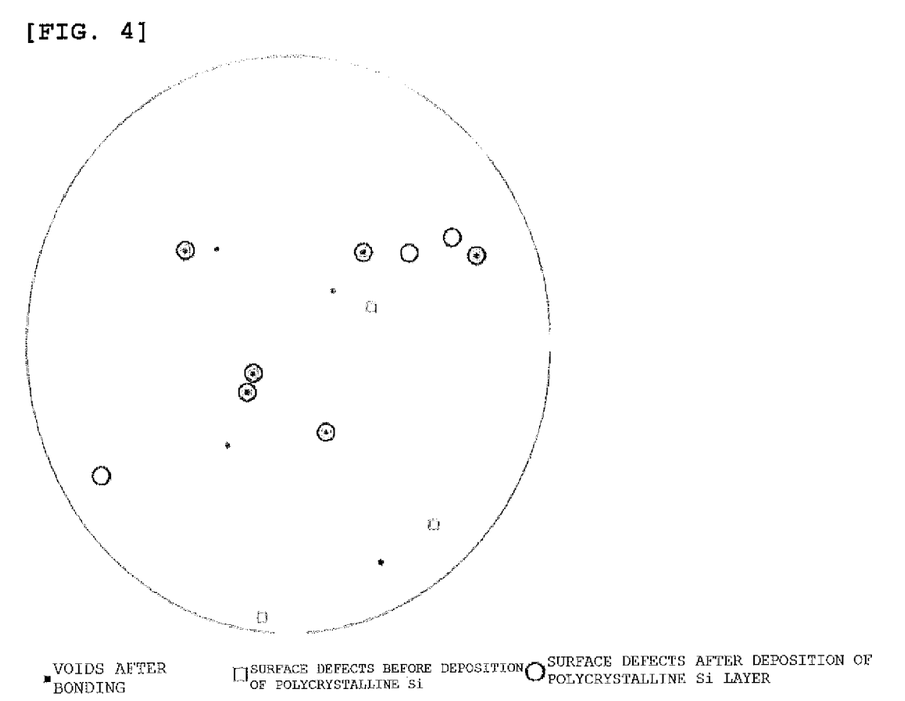
FIG. 4 is an overlapped map of surface LPDs before and after deposition of polycrystalline silicon and voids of a bonded SOI wafer.

Furthermore, a bonded SOI wafer was fabricated by using this substrate to be bonded, an entire wafer surface was scanned by a bright-field optical microscope to take in images, and void defects were extracted by comparing contrasts of the images. Then, coordinates of the void defects were superimposed on the overlapped map. FIG. 4 shows this result. As shown in the overlapped map of FIG. 4, it has been found out that the defects detected at the same position before and after deposition of the polycrystalline silicon layer become voids 100% after bonding.

Changing the viewpoint, it can be said that this discovery is the discovery of an evaluation method which enables detecting only defects which cause voids of a bonded SOI wafer at high sensitivity. When this evaluation method is incorporated in a substrate-to-be-bonded manufacturing process, only wafers having defects which cause voids can be selectively determined as defective products, and manufacturing yield loss of the substrates to be bonded (an excessive reduction in manufacturing yield) can be rationally avoided.

In a conventional bonded SOI wafer manufacturing process, a substrate-to-be-bonded quality determining standard is set to the number of surface defects of a polycrystalline silicon layer alone. At this rate, however, as shown in FIG. 4, wafers having only defects which do not cause voids are also determined as defective products, and hence the substrate-to-be-bonded manufacturing yield is lowered more than necessity.

Figure 1:
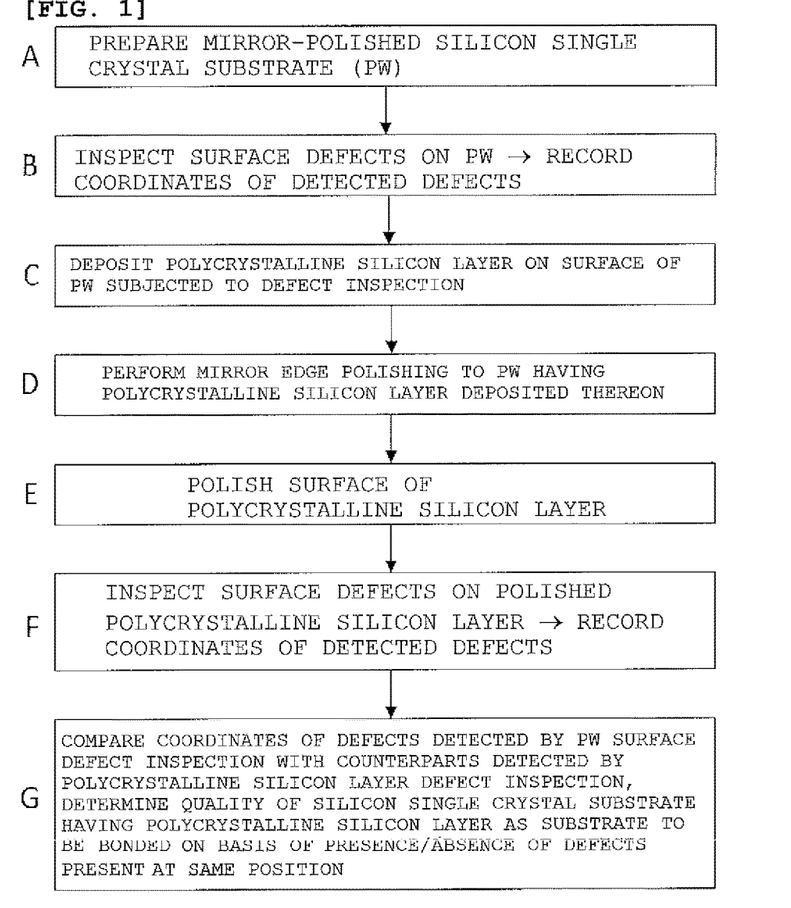
FIG. 1 is a process flowchart of a method for evaluating surface defects of a substrate to be bonded according to the present invention.

A more detailed description will now be given on the present invention with reference to a process flowchart of the method for evaluating surface defects of a substrate to be bonded according to the present invention shown in FIG. 1.

First, a mirror-polished silicon single crystal substrate (PW: Polished Wafer) is prepared (a step A). A general method for manufacturing a silicon single crystal substrate can be used for manufacture of the silicon single crystal substrate to be prepared and, specifically, a silicon single crystal substrate subjected to single-crystal pulling, cylindrical grinding, notch machining, slicing, chamfering, lapping, etching, double-side polishing, mirror edge polishing, final polishing, and the like can be used.

Then, surface defects of the mirror-polished silicon single crystal substrate are inspected (a step B). It is preferable to inspect the surface defects on the silicon single crystal substrate surface subjected to final cleaning after the final polishing. As a surface defect inspection tool, Surfscan SPX (X=1 to 3) manufactured by KLA-Tencor Corporation can be used, and scattered lights in a dark field are detected as LPDs. It is preferable to set a detection threshold value to detect problematic pits to 250 nm or more. At this time, coordinate data of all detected defects is acquired and recorded. The coordinate data can be acquired as a KLARF file when the defect detector is Surfscan SPX manufactured by KLA-Tencor Corporation. Although the standard can be set at this step, the pits are completely filled by subsequent deposition of a polycrystalline silicon layer or, even if the pits are not completely filled, they remain as such shallow pits that they are flattened by polishing at a later step, or defects to be remedied are also present. Thus, in view of a manufacturing yield of the mirror-polished silicon single crystal substrate, it is preferable to set no standard at this step or to configure a very rough setting.

Then, the polycrystalline silicon layer is deposited on the surface of the silicon single crystal substrate subjected to the defect inspection (a step C). The deposition of the polycrystalline silicon layer can be carried out in accordance with, e.g., a technology described in Patent Literature 2. A film thickness of the polycrystalline silicon layer is set to, e.g., 1 to 5 µm or preferably 2 to 3 µm while considering a later polishing stock removal. Further, after forming the polycrystalline silicon layer, it is preferable to perform cleaning using SC1 (a mixed aqueous solution of $NH_4OH$ and $H_2O_2$) and SC2 (a mixed aqueous solution of HCl and $H_2O_2$) or cleaning for a hydrophilic surface forming treatment such as ozonated water cleaning. When the hydrophilic surface is formed, adhesion of slurry burn can be avoided at a subsequent mirror edge polishing step.

Then, the mirror edge polishing is performed to the silicon single crystal substrate having the polycrystalline silicon layer deposited thereon (a step D). As this mirror edge polishing, the same mirror edge polishing as that performed at the step of manufacturing the mirror-polished silicon single crystal substrate is carried out to remove a polycrystalline silicon film grown on a wafer edge portion. At a subsequent polishing step, a workpiece holder which is disposed to a polishing head and called a template is used. The template is a composite base material of a glass epoxy resin ring and a backing pad, and an inner peripheral wall of this glass epoxy resin ring is constantly in contact with a silicon single crystal substrate edge portion during polishing. That is, the mirror edge polishing is performed here to reduce dust emission from the edge portion or sliding friction against the ring inner peripheral wall.

Then, the surface of the polycrystalline silicon layer is polished (a step E). At this step, the same surface polishing as that performed at the step of manufacturing the mirror-polished silicon single crystal substrate is carried out to the polycrystalline silicon layer. Setting a polishing stock removal to 0.4 µm or more is preferable for an improvement in surface roughness. Furthermore, setting the polishing stock removal to 1 µm or less enables enhancing productivity.

Subsequently, surface defects on the polished polycrystalline silicon layer are inspected (a step F). At this step, measurement using the same inspection tool and the same threshold value conditions as those of the step of inspecting the surface defects on the silicon single crystal substrate (the step B) is carried out to the polycrystalline silicon layer surface subjected to the final cleaning after the polishing. Coordinate data of all detected defects is acquired and recorded in the same manner as the step B.

Moreover, the coordinates of the defects detected at the step of inspecting the surface defects on the silicon single crystal substrate (the step B) are compared with the coordinates of the surface defects detected at the step of inspecting the surface defects on the polycrystalline silicon layer (the step F), and quality of the silicon single crystal substrate having the polycrystalline silicon layer as the substrate to be bonded is determined on the basis of presence/absence of defects present at the same position (a step G). Here, when a distance between both defects is 500 µm or less, these defects can be determined as the same defect while taking a coordinate accuracy in the defect measurement into consideration. Only the substrate to be bonded having the defects determined to be present at the same position is regarded as a defective product, and any other substrate to be bonded can be regarded as a non-defective product. Additionally, the substrate to be bonded determined to be a non-defective product can be submitted to a bonding step. It is to be noted that when the polishing of the deposited polycrystalline silicon layer is finished, the silicon single crystal substrate can be called the substrate to be bonded.

Figure 5:
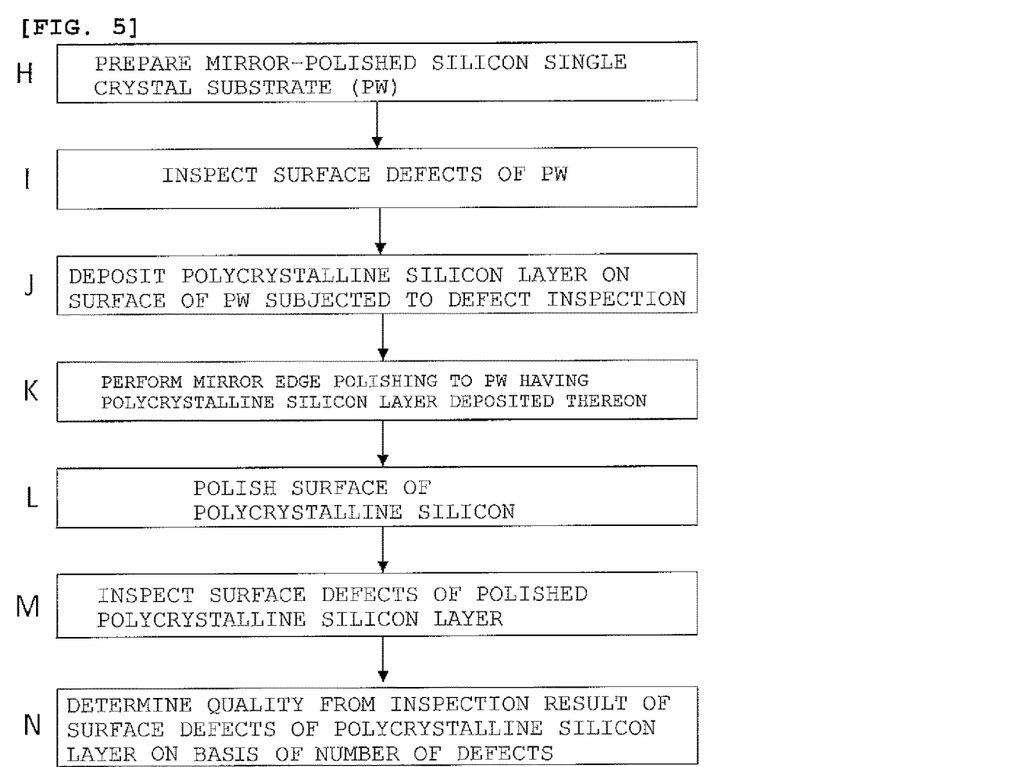
FIG. 5 is a process flowchart of a conventional method for evaluating surface defects of a substrate to be bonded.

For comparison, FIG. 5 shows a process flowchart of a conventional method for evaluating surface defects of a substrate to be bonded. In FIG. 5, since steps H, J, K, and L are the same as the steps A, C, D, and E in the method for evaluating surface defects of a substrate to be bonded according to the present invention, a description thereof will be omitted to avoid overlap.

Although the conventional method for evaluating surface defects of a substrate to be bonded has a step of inspecting surface defects on a mirror-polished silicon single crystal substrate (a step I), coordinates of detected defects do not have to be recorded. Further, the conventional method for evaluating surface defects of a substrate to be bonded has a step of inspecting surface defects on a polished polycrystalline silicon layer (a step M). In the conventional method, a standard for a quality determination of substrates to be bonded is provided to only the number of defects detected at this step. Thus, a void defect occurrence ratio of bonded SOI wafers increases when the standard for the number of defects is loosely set to enhance a manufacturing yield of the substrates to be bonded and, on the other hand, the manufacturing yield of the substrates to be bonded extremely decreases when the standard for the number of defects is rigorously set to reduce the void defect occurrence ratio of the bonded SOI wafers.

In the method for evaluating surface defects of a substrate to be bonded according to the present invention, surface defects are inspected on both the surface of the mirror-polished silicon single crystal substrate before deposition of the polycrystalline silicon layer and the surface of the polycrystalline silicon layer polished after deposition of the polycrystalline silicon layer, and each substrate to be bonded having the surface defects at the same position alone are determined as a defective product, whereby both rational avoidance of a reduction in manufacturing yield of the substrates to be bonded and a decrease in void defect occurrence ratio of the bonded SOI wafers can be achieved.

Furthermore, it is preferable for the substrate to be bonded used in the method for evaluating surface defects on a substrate to be bonded according to the present invention to be a base wafer for the bonded SOI wafer. When the substrate to be bonded is the base wafer for the bonded SOI wafer, the method for evaluating surface defects of a substrate to be bonded according to the present invention can be preferably applied to a manufacturing process of the bonded SOI wafer for advanced radio frequency devices.

EXAMPLES

The present invention will now be more specifically described with reference to an example and comparative examples, but the present invention is not restricted thereto.

Example

One hundred mirror-polished silicon single crystal substrates (diameter: 300 mm, crystal orientation: <100>) were prepared. SurfScan SP2 of KLA-Tencor Corporation was used for an inspection of surface defects of these mirror-polished silicon single crystal substrates, and a detection threshold value of defect sizes was set to 250 nm. After the defect inspection, coordinates of detected defects were recorded. Then, a polycrystalline silicon layer having a film thickness of 3 μm was deposited on the surfaces of the silicon single crystal substrates subjected to the defect inspection, and SC1 and SC2 cleaning was carried out. Thereafter, the mirror edge polishing was performed to the silicon single crystal substrates each having the polycrystalline silicon layer deposited thereon. Then, a polishing stock removal was set to 1 μm, the respective polycrystalline silicon layers were polished, and the SC1 and SC2 cleaning was carried out. Subsequently, the surfaces of the polished polycrystalline silicon layers were inspected under the same conditions as those described above by using SurfScan SP2, and coordinates of detected defects were recorded.

Moreover, the defect coordinates on the surface of each mirror-polished silicon single crystal substrate were compared and collated with the defect coordinates on the surface of each polished polycrystalline silicon layer. If a distance between both defects was 500 μm or less, the defects were regarded as defects present at the same position, and each evaluation target substrate-to-be-bonded having the defects present at the same position was determined as a defective product. A manufacturing yield of the substrates to be bonded at this moment was 97%. Additionally, each non-defective substrate to be bonded was subjected to a bonded SOI process as a base wafer to manufacture a bonded SOI wafer. Voids of each bonded SOI wafer were measured by scanning the entire wafer surface with the use of a bright-field optical microscope to take in images and comparing contrasts of the images to extract defects. A detection threshold value here was set to 10 μm. A void (defect) occurrence ratio here (a ratio of wafers having defects produced thereon among the manufactured bonded SOI wafers) was 2.0%. Table 1 shows the above-described results of Example.

TABLE 1

| | Standard | Manufacturing yield [%] | N | | Void occurrence ratio [%] |
|---|---|---|---|---|---|
| Example | No defects at same position | 97 | 100 | Subject non-defective products to bonded | 2.0 |
| Comparative Example 1 | ≤3 | 96 | 100 | | 7.2 |

TABLE 1-continued

| | Standard | Manufacturing yield [%] | N | | Void occurrence ratio [%] |
|---|---|---|---|---|---|
| Comparative Example 2 | ≤2 | 95 | 100 | SOI process → | 6.3 |
| Comparative Example 3 | ≤1 | 93 | 100 | | 3.2 |

Comparative Example 1

First, 100 mirror-polished silicon single crystal substrates were prepared. SurfScan SP2 of KLA-Tencor Corporation was used for an inspection of surface defects of these mirror-polished silicon single crystal substrates, and a detection threshold value of defect sizes was set to 250 nm. Here, all substrates were determined as non-defective products without providing standards.

Subsequently, a polycrystalline silicon layer having a film thickness of 3 μm was deposited on the surfaces of the silicon single crystal substrates subjected to the defect inspection, and SC1 and SC2 cleaning was carried out. Thereafter, the mirror edge polishing was performed to the silicon single crystal substrates each having the polycrystalline silicon deposited thereon. Then, a polishing stock removal was set to 1 μm, the respective polycrystalline silicon layers were polished, and the SC1 and SC2 cleaning was carried out. Subsequently, the surfaces of the polished polycrystalline silicon layers were inspected under the same conditions as those described above by using SurfScan SP2, and the number of defects were thereby obtained. In Comparative Example 1, the standard for the number of defects was set to three. A manufacturing yield of the substrates to be bonded at this moment was 96%.

Additionally, each non-defective substrate to be bonded was subjected to a bonded SOI process as a base wafer to manufacture a bonded SOI wafer. Voids of each bonded SOI wafer were measured by scanning the entire wafer surface with the use of a bright-field optical microscope to take in images and comparing contrasts of the images to extract defects. A detection threshold value here was set to 10 μm. A void occurrence ratio here was 7.2%. Table 1 shows the above-described results of Comparative Example 1.

Comparative Example 2

In Comparative Example 2, the quality of each substrate to be bonded was determined in the same manner as Comparative Example 1 except that the standard for the number of defects on a surface of each polished polycrystalline silicon layer was set to two. A manufacturing yield of the substrates to be bonded here was 95%. Further, a void occurrence ratio was obtained in the same manner as Comparative Example 1, and then a result was 6.3%. Table 1 shows the above-described results of Comparative Example 2.

Comparative Example 3

In Comparative Example 3, the quality of each substrate to be bonded was determined in the same manner as Comparative Example 1 except that the standard for the number of defects on a surface of each polished polycrystalline silicon layer was set to one. A manufacturing yield of the substrates to be bonded here was 93%. Further, a void occurrence ratio was obtained in the same manner as Comparative Example 1, and then a result was 3.2%. Table 1 shows the above-described results of Comparative Example 3.

As described above, in Example, the manufacturing yield of the substrates to be bonded was high, and the void occurrence ratio was low. On the other hand, in each of Comparative Examples 1 to 3, the manufacturing yield was decreased by lowering the standard for the number of defects on each substrate to be bonded, but the void occurrence ratio was improved. However, in Comparative Examples, it was impossible to achieve both the high manufacturing yield of the substrates to be bonded and the low void occurrence ratio of the bonded SOI wafers. Thus, the effectiveness of the present invention was exhibited.

It is to be noted, that the present invention is not restricted to the foregoing embodiment. The foregoing embodiment is an illustrative example, and any example which has substantially the same structure and exerts the same functions and effects as the technical concept described in claims of the present invention is included in the technical scope of the present invention.

The invention claimed is:

1. A method for evaluating surface defects of a substrate to be bonded, comprising the steps of:
    preparing a mirror-polished silicon single crystal substrate;
    inspecting surface defects on the mirror-polished silicon single crystal substrate;
    depositing a polycrystalline silicon layer on a surface of the silicon single crystal substrate subjected to the defect inspection;
    performing mirror edge polishing to the silicon single crystal substrate having the polycrystalline silicon layer deposited thereon;
    polishing a surface of the polycrystalline silicon layer;
    inspecting surface defects on the polished polycrystalline silicon layer; and
    comparing coordinates of defects detected at the step of inspecting the surface defects on the silicon single crystal substrate with counterparts detected at the step of inspecting the surface defects on the polycrystalline silicone layer and determining quality of the silicon single crystal substrate having the polycrystalline silicon layer as a substrate to be bonded on the basis of presence/absence of defects present at the same position.

2. The method for evaluating surface defects of a substrate to be bonded according to claim 1,
    wherein the substrate to be bonded is a base wafer for a bonded SOI wafer.

* * * * *